United States Patent [19]

Ohba et al.

[11] Patent Number: 5,136,322
[45] Date of Patent: Aug. 4, 1992

[54] LIGHT-SENSITIVE MATERIAL PROCESSING APPARATUS

[75] Inventors: Hisao Ohba, Kanagawa; Hisao Kanazaki; Kenji Kunichika, both of Shizuoka, all of Japan

[73] Assignee: Fuji Photo Film Co., Ltd., Kanagawa, Japan

[21] Appl. No.: 573,760

[22] Filed: Aug. 28, 1990

[30] Foreign Application Priority Data

| Aug. 31, 1989 | [JP] | Japan | 1-225323 |
| Aug. 31, 1989 | [JP] | Japan | 1-225324 |
| Aug. 31, 1989 | [JP] | Japan | 1-225325 |

[51] Int. Cl.$^5$ ............................. G03D 3/08
[52] U.S. Cl. ............... 354/320; 354/322; 354/325
[58] Field of Search ............... 354/317, 319, 320, 322, 354/324, 325; 15/77, 100, 102

[56] References Cited

U.S. PATENT DOCUMENTS

| 3,916,426 | 10/1975 | Bown | 354/325 |
| 4,119,991 | 10/1978 | Martino et al. | 354/320 |
| 4,148,576 | 4/1979 | Martino . | |
| 4,213,420 | 7/1980 | Martino et al. | 354/325 X |
| 4,383,751 | 5/1983 | Schornig et al. | 354/322 |
| 4,461,052 | 7/1984 | Mostul | 15/29 |
| 4,464,035 | 8/1984 | Schoering | 354/322 |
| 4,521,092 | 6/1985 | Ferrante | 354/320 |
| 4,706,320 | 11/1987 | Swift | 15/1.5 R |
| 4,922,278 | 5/1990 | Takeda et al. | 354/320 |

FOREIGN PATENT DOCUMENTS

| 0080659 | 6/1983 | European Pat. Off. . |
| 0327227 | 8/1989 | European Pat. Off. . |
| 3630569 | 3/1987 | Fed. Rep. of Germany . |
| 56-27251 | 6/1981 | Japan . |
| 58-102272 | 6/1983 | Japan . |
| 60-59351 | 4/1985 | Japan . |
| 61-130974 | 6/1986 | Japan . |
| 62-8153 | 1/1987 | Japan . |
| 62-167253 | 10/1987 | Japan . |
| 1-20551 | 1/1989 | Japan . |
| 2-118577 | 5/1990 | Japan . |

OTHER PUBLICATIONS

European Search Report.

Primary Examiner—L. T. Hix
Assistant Examiner—D. Rutledge
Attorney, Agent, or Firm—Sughrue, Mion, Zinn, Macpeak & Seas

[57] ABSTRACT

A light-sensitive material processing apparatus for processing an image-wise exposed light-sensitive material by immersing the light-sensitive material in a processing solution while the light-sensitive material is being automatically conveyed. The apparatus includes a scraping brush constituted by a shaft and a synthetic resin-made elongated brush wound spirally around an outer periphery of the shaft. Accordingly, the light-sensitive layer of the light-sensitive material is scraped off by the scraping brush to effect processing.

19 Claims, 10 Drawing Sheets

LIGHT-SENSITIVE MATERIAL PROCESSING APPARATUS

BACKGROUND OF THE INVENTION

1. Field of the Invention

The present invention relates to a light-sensitive material processing apparatus for processing an image-wise exposed light-sensitive material, while the light-sensitive material is being conveyed through and immersed in a processing solution.

2. Description of the Related Art

A light-sensitive material on which an image has been exposed, e.g., a presensitized printing plate for planographic process, is transported into a presensitized printing plate processor, which is a light-sensitive material processing apparatus, and is subjected to development in a developing tank provided in the presensitized printing plate processor, and is then washed in a rinsing tank or a washing tank before a finisher, i.e., a finishing solution, is applied thereto.

A developer is stored in the developing tank, and the presensitized printing plate for planographic process is conveyed to the developing tank and immersed in the developer therein so as to undergo development. During the conveyance through and immersion in the developer, non-image portions on the surfaces of the presensitized printing plate for planographic process on which the image has been exposed are scraped off by means of brushes disposed in the developer, and an image portion is kept intact for development.

With the conventional light-sensitive material processing apparatus, however, the brushes for scraping the surfaces of the light-sensitive material are formed by being embedded in their shafts, so that the diameter of the brushes becomes large at 50 mm. In addition, the shafts also become large in diameter and are exposed to the outside from the surface of the processing solution. For this reason, there is a problem in that if the large-diameter brushes rotate, the processing solution is sucked up, thereby deteriorating the processing solution as it is brought into contact with the air. Furthermore, the size of the developing tank in which the large-diameter brushes are disposed is disadvantageously large.

In addition, if a brush with embedded bristles having an outside diameter of 50 mm or less is fabricated unreasonably, the bending strength of the bristles of the brush becomes large, resulting in problems that the surface of the light-sensitive material is damaged and bending the rear-end portion of the light.sensitive material occurs as the rear-end portion of the light.sensitive material is kicked up by the brush.

In addition, it has been proposed to use a channel brush (bristles are formed by being supported in an elongated channel) instead of the brush with embedded bristles. However, since the channel brush is fabricated by being wound spirally in a channel formed in the shaft, a gap corresponding to the width of the channel is created between adjacent portions of the brush wound. For this reason, it is impossible for the channel brush to uniformly scrape the surface of the light.sensitive material, resulting in an unevenness in the development of the light.sensitive material.

SUMMARY OF THE INVENTION

Accordingly, an object of the present invention is to provide a compact light.sensitive material processing apparatus which is capable of uniformly scraping the surface of a light.sensitive layer without damaging the surface of the light.sensitive material and without bending the rear-end portion of the light-sensitive material, thereby overcoming the above-described drawbacks of the conventional art.

To this end, in accordance with the present invention, there is provided a light.sensitive material processing apparatus for processing an image-wise exposed light-sensitive material by immersing the light-sensitive material in a processing solution accommodated in a processing tank, while the light.sensitive material is being conveyed, the apparatus comprising: scraping brush means constituted by a shaft and an elongated brush wound spirally around an outer periphery of the shaft and formed of a synthetic resin, the scraping brush means being adapted to scrape a light-sensitive surface of the light.sensitive material; and bending preventing means disposed downstream of the scraping brush means in a direction of conveyance of the light-sensitive material and adapted to prevent the bending of a rear-end portion of the light.sensitive material scraped by the scraping brush means.

In accordance with the present invention having the above-described arrangement, the image-wise exposed light-sensitive material, while being conveyed, is immersed in the processing solution. In the course of this immersion, an unnecessary light.sensitive layer on the light.sensitive surface of the light.sensitive material is scraped off by the scraping brush means, and the light..sensitive material is subjected to processing.

Since the scraping brush for scraping the light. sensitive layer of the light.sensitive material is formed by spirally winding the synthetic resin-made elongated bristles around the shaft, the diameter of the brush is made small, and the diameter of the wire bristle can also be made small, so that the bending strength of the bristles becomes small. As a result, the scraping brush means is made compact, and does not cause damage to the light.sensitive material surface.

In addition, since the bending strength of the brush becomes small, the rear-end portion of the light-sensitive material is prevented from being bent by the brush.

Furthermore, since the elongated bristles are wound densely, the light.sensitive layer of the light-sensitive material can be scraped uniformly, so that processing can be effected uniformly.

Also, the light.sensitive material processing apparatus has bending preventing means disposed downstream of the scraping brush means in the direction of conveyance of the light-sensitive material, so that the rear-end portion of the light-sensitive material scraped by the scraping brush means is prevented from being bent.

In accordance with one mode of the invention, the scraping brush means is characterized by being formed by inserting a twisted brush into a spiral groove formed in the shaft such that the twisted brush is wound spirally around the shaft.

In this mode, the scraping brush mean is formed by inserting the twisted brush into the groove provided in the shaft. As a result, the scraping brush means can be made compact, and the diameter of the bristles can be made small. Hence, the bending strength of the bristles becomes small, so that it is possible to scrape off the unnecessary light-sensitive layer without damaging the light.sensitive layer surface of the light.sensitive material. In addition, with the scraping brush means thus formed, a gap caused by the channel in the prior art is not created between the adjacent portions of the scraping brush, so that the light-sensitive material can be processed uniformly.

In another mode of the present invention, an elongated carpet brush is characterized by being wound spirally around the shaft, thereby constituting the scraping brush means.

In this mode, the scraping brush means is formed by spirally winding the elongated carpet brush around the shaft. As a result, the scraping brush means can be made compact, and the diameter of the bristles can be made small. Hence, the bending strength of the bristles becomes small, so that it is possible to scrape off the unnecessary light-sensitive layer without damaging the light-sensitive layer surface of the light.sensitive material. In addition, since the scraping brush means thus formed is wound densely around the shaft, a gap caused by the channel in the prior art is not created between the adjacent portions of the scraping brush, thereby making it possible to uniformly process the light-sensitive material.

In still another mode of the invention, the bending preventing means may be formed of a plate member, or may be formed by bending wire rods into a frame-like configuration or by joining them.

The light-sensitive material processing apparatus may further comprise a floating cover (developer level cover) for covering the surface of the processing solution and adapted to float on the surface of the processing solution, thereby making it possible to reduce the deterioration of the processing solution due to air and reduce the evaporation of water in the processing solution.

The floating cover is preferably formed into a configuration for covering an exposed portion of the scraping brush means exposed above the processing solution. For instance, the floating cover may be provided with a projecting portion projecting away from the solution level in correspondence with the exposed portion of the scraping brush means. Also, the projecting portion may preferably be provided with shielding portions for covering axially opposite ends of the brush means.

The above and other objects, features and advantages of the present invention will become more apparent from the following detailed description of the invention when taken in conjunction with the accompanying drawings.

DESCRIPTION OF THE PREFERRED EMBODIMENTS

Figure 1:
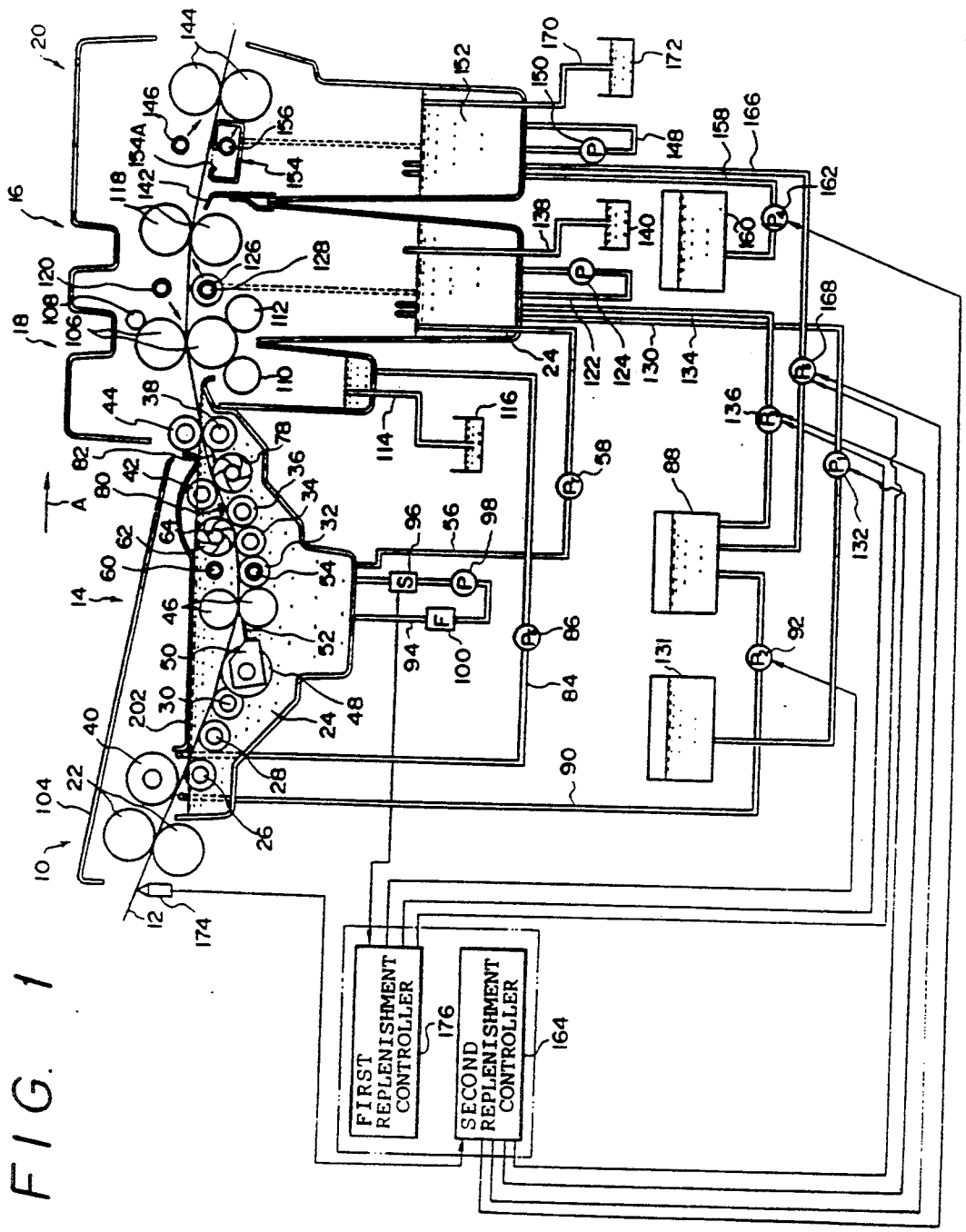
FIG. 1 is a schematic diagram illustrating an embodiment of a presensitized printing plate processor in accordance with the present invention.

FIG. 1 illustrates an embodiment of a presensitized printing plate processor 10 which is an example of a light-sensitive material processing apparatus in accordance with the present invention.

The presensitized printing plate processor 10 comprises a first developing tank 14 for developing a presensitized printing plate (hereafter referred to as PS plate) 12 with an image exposed by an unillustrated printer; a second developing tank 16 for auxiliary developing the PS plate 12; an overflow tank 18 interposed between the first developing tank 14 and the second developing tank 16; and a finisher tank 20 for applying a finisher 152 to the PS plate 12.

First Developing Tank

As shown in FIG. 1, a pair of conveying rollers 22 are disposed on the side of the first developing tank 14 for insertion of the PS plate 12. The PS plate 12 with an image exposed thereon by an unillustrated printer is inserted between the pair of conveying rollers 22, and the PS plate 12 inserted is conveyed into the presensitized printing plate processor 10 in a conveying direction (in the direction of arrow A in FIG. 1).

The upper side of the first developing tank 14 is open, and a central portion of its bottom projects downward, thereby forming a substantially dish-shaped configuration. A developer 24 is accommodated in the first developing tank 14. Guide rollers 26, 28, 30, 32, 34, 36, 38 having the same diameter are disposed inside the first developing tank 14 along bottom wall portions thereof. These guide rollers 26–38 form split-type rollers in which a plurality of resilient roller members are pivotally supported on outer peripheries of their shafts, the shafts being supported by spanning an unillustrated pair of side plates.

A guide roller 40 having a larger diameter than that of the guide roller 26 is disposed above the guide roller 26, while a guide roller 42 is disposed above the guide roller 36. A guide roller 44 is disposed above the guide roller 38. These guide rollers 40, 42 and 44 are supported on the unillustrated pair of side plates in the same way as the guide rollers 26–38.

A pair of conveying rollers 46 are interposed between the guide roller 30 and the guide roller 32 in a central portion of the first developing tank 14. This pair of conveying rollers 46 are supported by the unillustrated pair of side plates, and rotate as a driving force of an unillustrated driving means is imparted thereto.

A guide roller 48 having a larger diameter than that of the guide roller 30 is interposed between the pair of conveying rollers 46 and the guide roller 30. This guide roller 48 is a split-type roller and is supported by the pair of side plates in the same way as the guide rollers 24–38. A guide 52 is supported to the guide roller 48 via a bracket 50. The guide 52 has one end fixed to the bracket 50 and the other end oriented toward the pair of conveying rollers 46. Thus the PS plate 12 is guided to between the pair of conveying rollers 46.

Accordingly, the PS plate 12 fed to the first developing tank 14 by the pair of conveying rollers 22 is inserted between the guide roller 26 and the guide roller 40, is then guided by the guide rollers 28, 30 and 48 and falls diagonally downward, and then inserted between the pair of conveying rollers 46 by the guide 52. After passing through the pair of conveying rollers 46, the PS plate 12 is guided by the guide rollers 32, 34, 36, 42 and 38 and rises diagonally upward, and is then fed out toward the overflow tank 18 while being guided by the guide roller 44. Thus the PS plate 12 is immersed in the developer 24 in the first developing tank 14 and is subjected to development.

The guide roller 32 is formed in such a manner that a plurality of resilient rotating members are pivotally supported on an outer periphery of a spray pipe 54 with a plurality of discharge ports formed along the axial direction thereof. This spray pipe 54 communicates with one end of a pipeline 56. The other end of the pipeline 56 is passed through a bottom of the second developing tank 16 and is open inside the second developing tank 16. Disposed midway in the pipeline 56 is a supply pump 58 (P7) whereby the developer 24 inside the second developing tank 16 is supplied into the spray pipe 54.

A spray pipe 60 is disposed above the guide roller 32. The spray pipe 60 has a plurality of discharge ports which are arranged along the axial direction thereof and are open toward the pair of conveying rollers 46. This spray pipe 60 also communicates with the pipeline 56, and the developer 24 in the second developing tank 16 is supplied thereto by the supply pump 58.

A brush 62 is interposed between the spray pipe 60 and the guide roller 42. The brush 62 has a rotating shaft 64 rotatably supported by the unillustrated pair of side plates and rotates as a driving force of an unillustrated driving means is imparted thereto.

Figure 2:
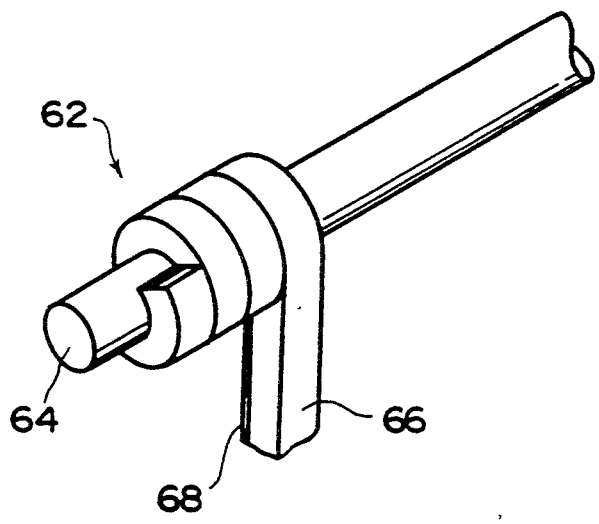
FIG. 2 is a perspective view of a brush.

As shown in FIG. 2, the brush 62 has an elongated carpet brush 66 spirally wound around and adhered to the rotating shaft 64 via a nylon sheet 68. The bristles of the brush 66 are formed of nylon, ETEF, PPS, PP, or the like. The outside diameter of the brush 62 is 40 mm or less, preferably 20-40 mm, while the diameter of the bristle is set to 20-70$\mu$. The number of revolutions of the brush 62 is set to 300 r.p.m. or less, preferably 60-200 r.p.m.

Figure 3:
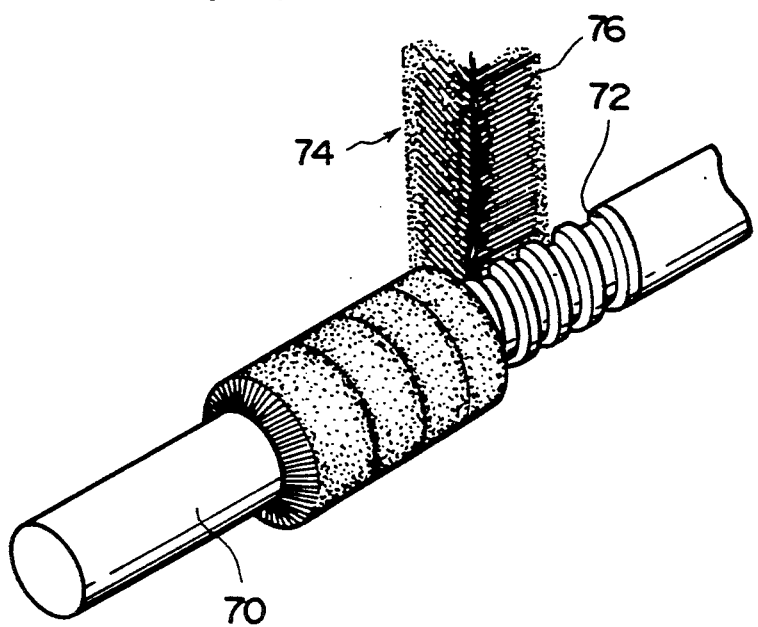
FIG. 3 is a perspective view illustrating another example of the brush.
Figure 4:
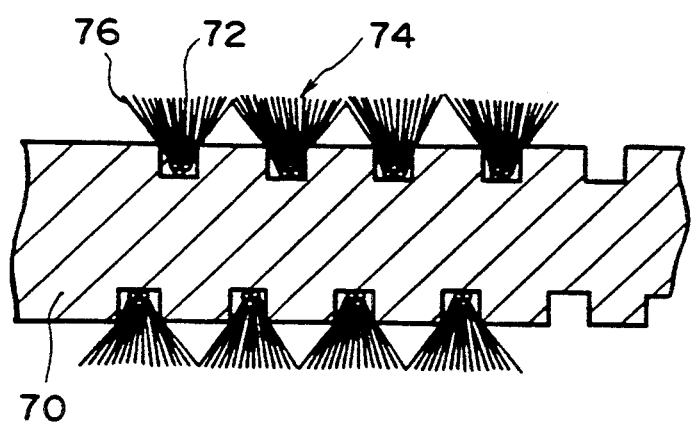
FIG. 4 is a cross-sectional view of the brush shown in FIG. 3 and taken along its axial direction.

As shown in FIG. 3, the brush 62 may be formed by providing its rotating shaft 70 with a spiral groove 72 and by inserting a twisted brush 74 into the groove 72 and winding the same around the shaft 70. In this case, the twisted brush 74 is formed by twisting two wires having bristles 76 therebetween to fix them. If the wires of the twisted brush 74 are inserted into the groove 72, the bristles 76 project substantially uniformly to outside the groove 72 in a spreading manner, and the radially projecting bristles 76 are thus disposed substantially uniformly around the rotating shaft 70. The twisted brush 74 is formed of the same material as that of the aforementioned carpet brush 66.

As shown in FIG. 1, a brush 78 having the same construction as that of the brush 62 is disposed underneath a conveying passage of the PS plate 12 between the guide roller 36 and the guide roller 38.

Figure 5:
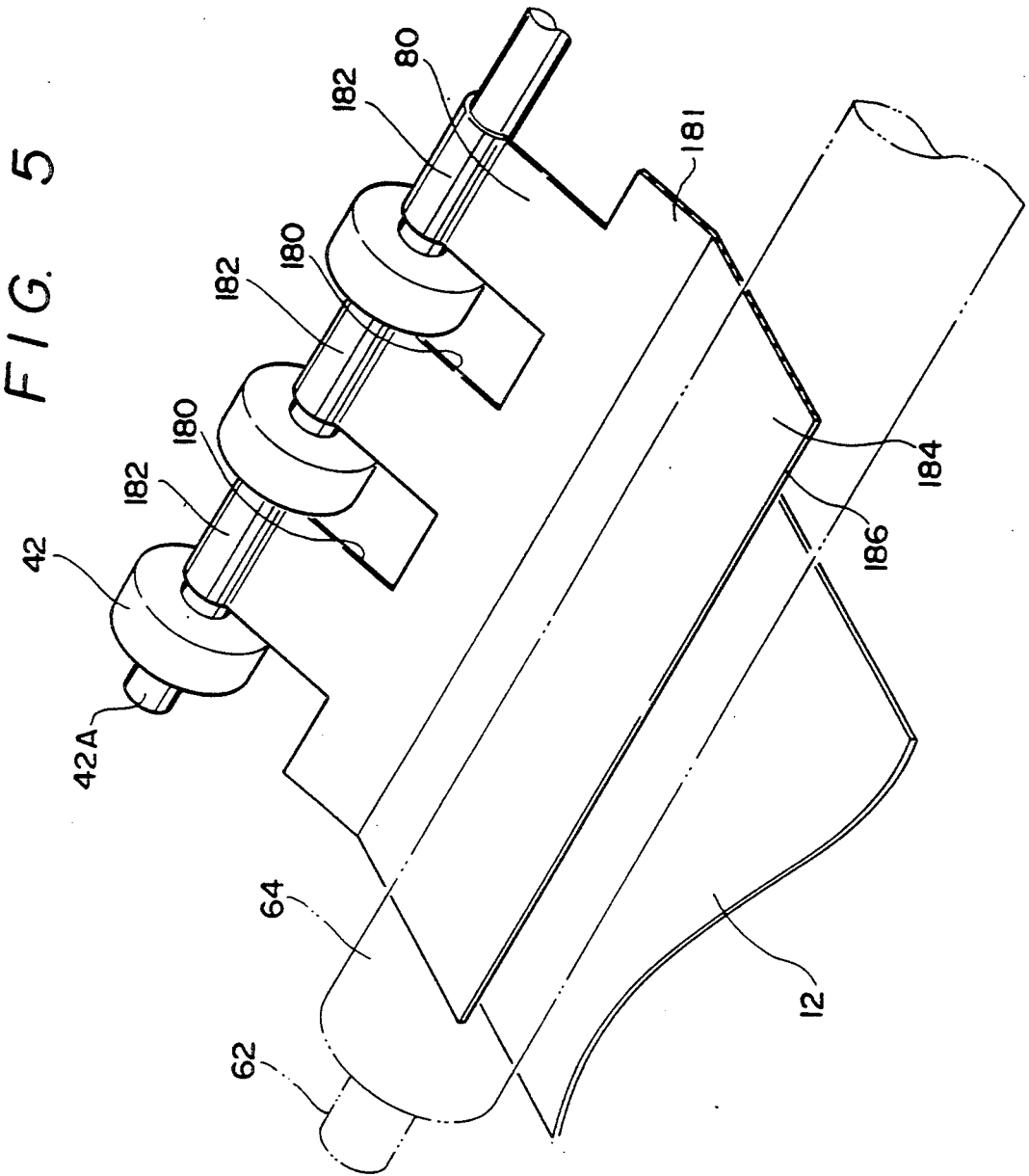
FIG. 5 is a perspective view of a spring-up preventing plate.
Figure 6:
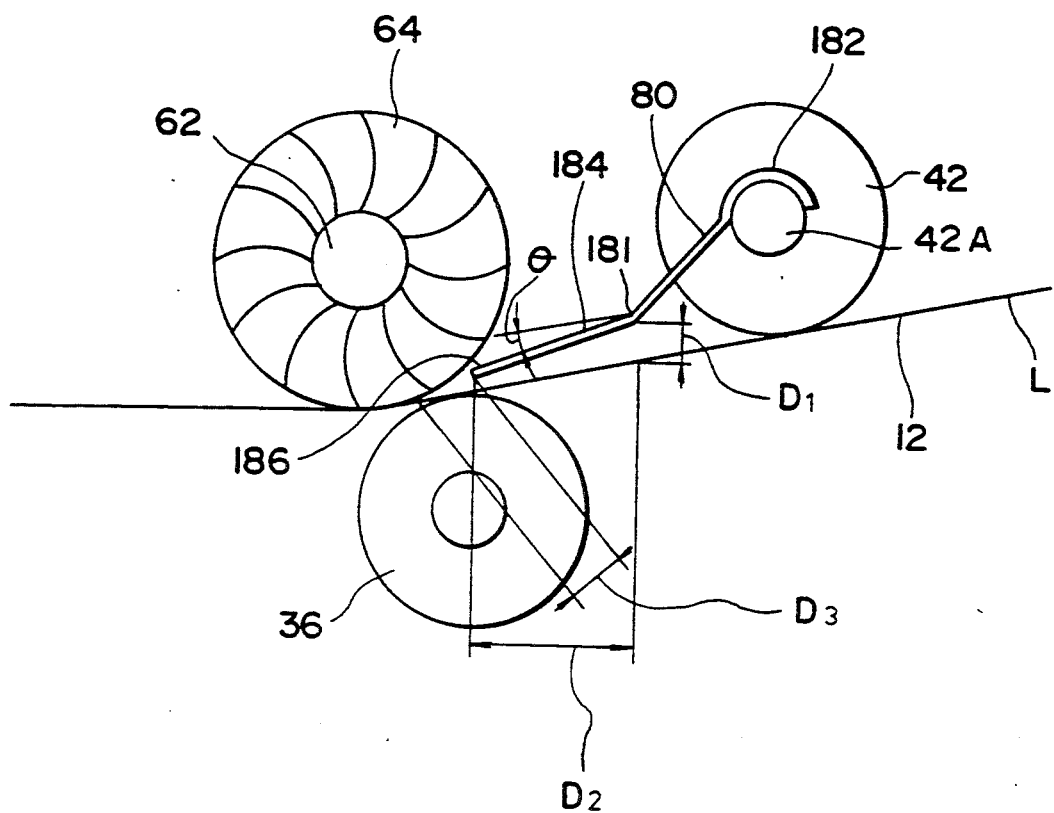
FIG. 6 is a cross-sectional view illustrating the relationship between the brush and the spring-up preventing plate.

A spring-up preventing plate 80 serving as a means for preventing the bending of the PS plate 12 is disposed between the brush 62 and the guide roller 42. As shown in FIGS. 5 and 6, the spring up preventing plate 80 is constituted by a substantially rectangular plate and is arranged such that one end portion thereof is supported by a rotating shaft 42A of the guide roller 42 and an opposite end portion thereof extends toward the brush 62. The one end portion of the spring-up preventing plate 80 is provided with a plurality of rectangular notches 180 at predetermined intervals in the widthwise direction thereof. The guide roller 42 is inserted into each of the notches 180, and respective portions between the adjacent notches 180 serve as supporting portions 182 of the spring-up preventing plate 80 for being supported by the rotating shaft 42A of the guide roller 42. Each of the supporting portions 182 has a curved surface conforming with a peripheral surface of the rotating shaft 42A of the guide roller 42. The spring-up preventing plate 80 is affixed to the rotating shaft 42A of the guide roller 42 by means of unillustrated bolts or the like with these curved surfaces abutting against the rotating shaft 42A.

An intermediate portion of the spring-up preventing plate 80 substantially conforming with the advancing direction of the light.sensitive material is formed into a bent portion 181 which is bent in the direction in which a distal end 186 (a brush 62-side end) is spaced apart from the conveying passage L of the light.sensitive material. A flat portion 184 is formed in such a manner as to extend from the bent portion 181 to the distal end 186 (the brush 62-side end). As shown in FIG. 6, the height $D_1$ from the conveying passage L of the light-sensitive material to the bent portion 181 is set to 5 mm or less, and the length $D_2$ of the flat portion 184 substantially along the conveying passage L is set to 5-50 mm, preferably 20-50 mm. In addition, the angle of inclination of the flat portion 184 with respect to the conveying passage L is set to not less than $-10$ degrees and not more than $+10$ degrees.

In addition, the distance $D_3$ between the brush 62 and the distal end 186 of the flat portion 184 is set to $\pm 1-5$ mm, preferably 0- -1 mm. Here, 0 mm means a state in which the distal end 186 abuts against the brush 62. Also, it is assumed that the state in which the distal end 186 is spaced apart from the brush 62 with this abutting state as a reference is indicated by minus ($-$), and the state in which the distal end 186 bites into the brush 62 is indicated by plus ($+$).

As the brush 62 rotates counterclockwise in FIG. 6, the spring.up preventing plate 80 supports a rear-end portion of the PS plate 12 even if the rear end portion of the PS plate 12 which has passed between the brush 62 and the guide roller 36 is pressed upward, thereby preventing the PS plate 12 from being bent upward.

Furthermore, a spring.up preventing plate 82 is disposed between the brush 78 and the guide roller 38. The spring-up preventing plate 82 is arranged in the same way as the spring.up preventing plate 80 and supports the rear-end portion of the PS plate 12 so as to prevent it from being bent downward.

A pipeline 84 communicating with a bottom of the overflow tank 18 is open above the first developing tank 14. A supply pump 86 (P$_6$) is disposed midway in the pipeline 84. In addition, a pipeline 90 communicating with a water supply tank 88 is open above the first developing tank 14, and a water supply pump 92 (P$_2$) is disposed midway in the pipeline 90. This water supply pump 92 is connected to a first replenishment controller 176 which will be described later. The first replenishment controller 176 controls the timing at which water is supplied to the first developing tank 14.

One end of a pipeline 94 communicates with a lower portion of the first developing tank 14. A conductivity detector 96 (S), a circulation pump 98, and a filter 100 (F) are disposed midway in the pipeline 94, and the other end of the pipeline 94 communicates again with the lower portion of the first developing tank 14. Accordingly, after the developer 24 stored in the lower portion of the first developing tank 14 passes through the pipeline 94 and through the conductivity detector 96 and the filter 100, the developer 24 is sent again to the spray pipes 54, 60 inside the first developing tank 14. As a result, the electrical conductivity of the developer 24 is detected, the dust in the developer 24 is removed, and the developer 24 inside the first developing tank 14 is stirred.

The conductivity detector 96 also detects the electrical conductivity of the developer 24 passing through the pipeline 94, detects the electrical conductivity of the developer 24 in the first developing tank 14, and transmits the detected result to the first replenishment controller 176.

Figure 7:
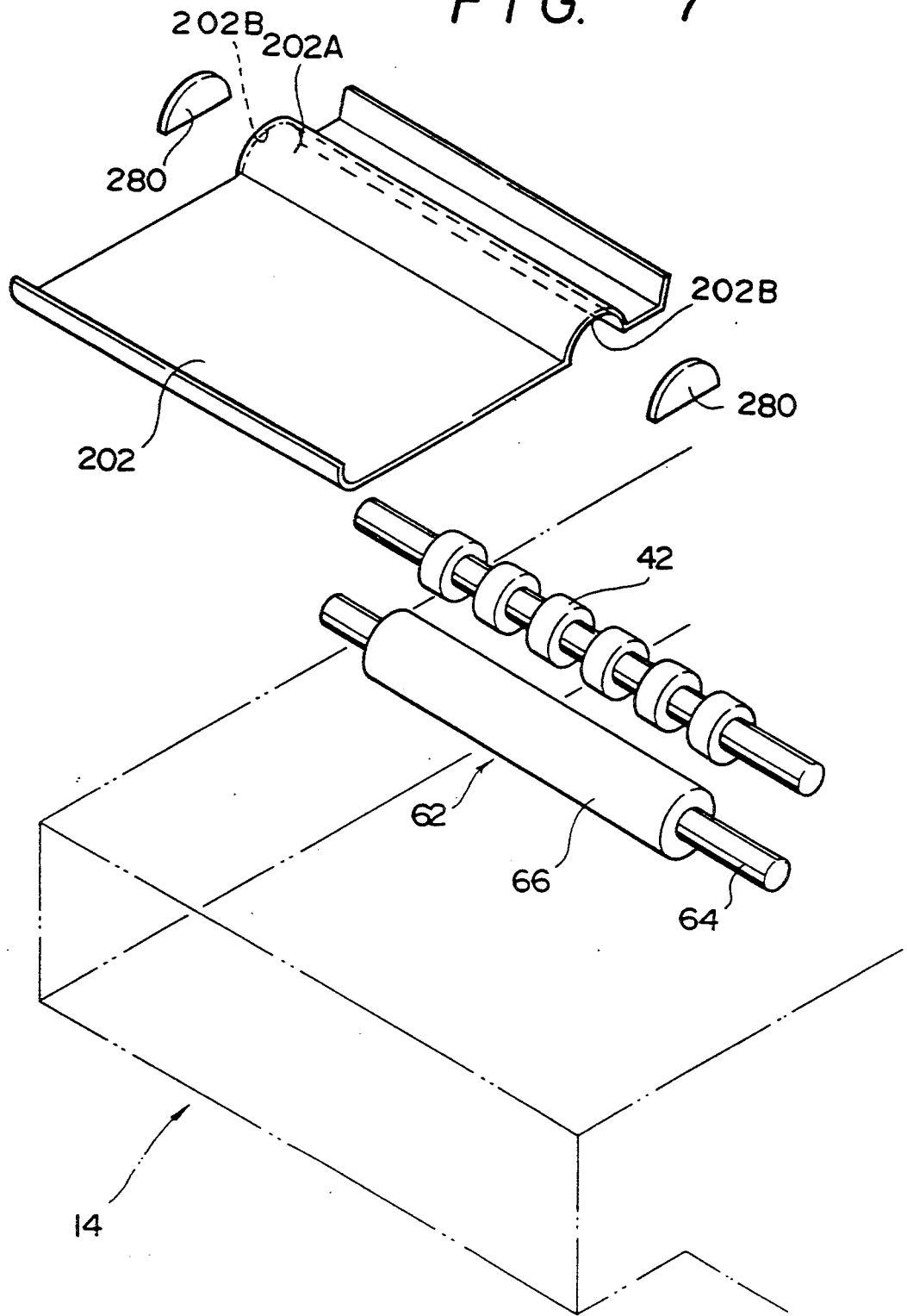
FIG. 7 is a perspective view of a developer level cover.

A developer level cover 202 is disposed so as to cover the surface of the developer 24 in the first developing tank 14. As shown in FIG. 7, a bent portion 202A projecting upwardly of the liquid level into a configuration of a substantially circular arc in terms of its cross section is formed in a portion of the developer level cover 202 corresponding to the brush 62 and the guide roller 42. A portion of the brush 62 projecting upwardly of the liquid level and a portion of the guide roller 42 projecting upwardly of the liquid level are accommodated within the inner portion of the bent portion 202A on the liquid level side. Openings 202B are respectively formed at widthwise opposite ends of the bent portion 202A, i.e., at opposite ends in the axial direction of the guide roller 42. These openings 202B are closed by circular arc-shaped shielding plates 280, respectively.

In addition, the movement of the developer level cover 202 in the direction of conveyance of the PS plate 12 is restricted by an unillustrated stopper provided on an inner wall of the first developing tank 14, but the movement of the developer level cover 202 in the height-wise direction of the developer level is not restricted. Accordingly, when the amount of the developer 24 in the first developing tank 14 becomes small and the level of the developer 24 is thereby lowered, the developer level cover 202 also moves downward correspondingly. As a result, since developer level cover 202 reduces the area of contact between the developer level cover 202 and air, the developer level cover 202 prevents the deterioration of the developer 24 which can occur as the developer 24 is brought into contact with carbon dioxide contained in the air. In addition, the developer level cover 202 also prevents the evaporation of the developer 24.

The configuration of the developer level cover 202 is set so that the shielding rate of the developer 24 with respect to air becomes not less than 40%, preferably not less than 60%. This configuration is determined by the configuration of the opening of the first developing tank 14, portions projecting from the developer 24, and the like.

The developer level cover 202 is formed of a lightweight material so as to float on the liquid level of the developer 24 inside the first developing tank 14, as described above. For instance, the developer level cover 202 is preferably formed of a synthetic resin, such as polyvinyl chloride, polyethylene, polyamide, or polyester, a lightweight metal, a foam plastic, or other similar material.

Figure 8:
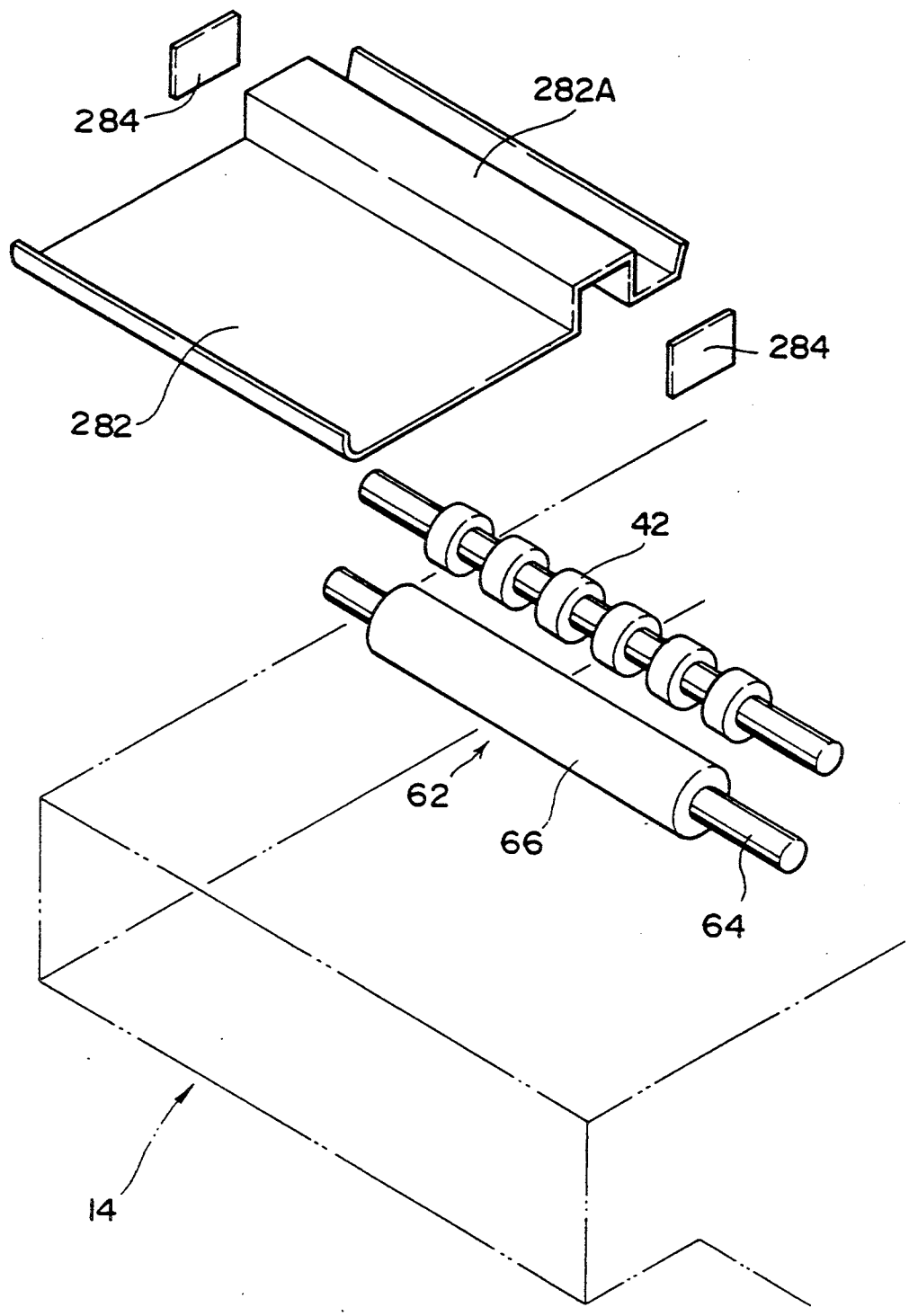
FIG. 8 is a perspective view of another example of the developer level cover.

It should be noted that a rectangular bent portion 282A may be provided instead of the bent portion 202A of the developer level cover 202, as shown in FIG. 8. Each shielding plate 284 for closing the opposite ends of the bent portion 282A is also formed into a rectangular configuration.

A guide cover 104 for re-entry is disposed in an upper portion of the first developing tank 14. The guide cover 04 is used for guiding the insertion of the PS plate 12 which has been processed once into the second developing tank 16 by jumping the first developing tank 14 so as to effect both development and finisher processing again.

Overflow Tank Overflow

An upper portion of a side wall of the first developing tank 14 located on the overflow tank 18 side is folded toward the overflow tank 18, and the developer 24 in the first developing tank 14 overflows from this upper portion of the side wall so as to be recovered in the overflow tank 18.

A pair of conveying rollers 106 are disposed above the side walls serving as a partition between the overflow tank 18 and the second developing tank 16. The pair of conveying rollers 106 are rotatably supported by the unillustrated side plates, and rotate as a driving force of the unillustrated driving means is imparted thereto. The PS plate 12 fed out from between the guide rollers 38, 44 is inserted between the pair of conveying rollers 106.

A small-diameter roller 108 is disposed in contact with the upper one of the pair of conveying rollers 106. The roller 108 prevents the developer 24 in the second developing tank 16 attached to the upper one of the pair of conveying rollers 106 from dropping in the overflow tank 18.

A roller 110 disposed in the overflow tank 18 and a roller 112 disposed in the second developing tank 16 abut against the lower one of the pair of conveying rollers 106. The roller 110 prevents the developer 24 fetched by the PS plate 12 in the first developing tank 14 and adhered to the lower one of the conveying rollers 106 from mixing into the second developing tank 16. Meanwhile, the roller 112 prevents the developer 24 in the second developing tank 16 from dropping in the overflow tank 18.

A pipeline 114 passing through the bottom of the overflow tank 18 has one end extending from that bottom up to a predetermined height, and the height of the level of the developer 24 in the overflow tank 18 is determined by the height of this pipeline 114 from the bottom of the overflow tank 18. The other end of the pipeline 114 is open in a drain tank 116.

Second Developing Tank

A pair of conveying rollers 118 are disposed in an upper portion of the second developing tank 16 adjacent to the finisher tank 20. The pair of conveying rollers 118 are rotatably supported by the unillustrated side plates, and rotate as a driving force of the unillustrated driving means is imparted thereto. The PS plate 12 fed out from between the pair of conveying rollers 106 is inserted between the pair of conveying rollers 118. As a result, the PS plate 12 is conveyed in an upper portion of the second developing tank 16 substantially horizontally.

A spray pipe 120 having the same construction as that of the aforementioned spray pipe 60 is disposed above the conveying passage of the PS plate 12 between the upper one of the pair of conveying rollers 106 and the upper one of the pair of conveying rollers 118. Discharge ports of the spray pipe 120 for discharging the developer 24 are open toward the upper one of the pair of conveying rollers 106, and discharge the supplied developer 24 to between the upper one of the pair of conveying rollers 106 and the upper surface of the PS plate 12. The spray pipe 120 communicates with one end of a pipeline 122. The other end of the pipeline 122 communicates with the bottom of the second developing tank 16, a circulation pump 124 being disposed midway thereof. The developer 24 is stored in the lower portion of the second developing tank 16, and the developer 24 is supplied into the spray pipe 120 by the operation of the circulation pump 124. Thus the developer 24 is discharged and applied to the surface of the PS plate 12.

A guide roller 126 is disposed underneath the conveying passage of the PS plate 12 in correspondence with the spray pipe 120. The guide roller 126 is formed in such a manner that a plurality of resilient rotating members are pivotally supported on an outer periphery of a spray pipe 128 with a plurality of discharge ports formed along the axial direction thereof, in the same way as the guide roller 32. This spray pipe 128 communicates with the pipeline 122, and the developer 24 is supplied thereto by the operation of the circulation pump 124.

The spray pipe 128 has the plurality of discharge ports facing the space between the lower one of the pair of conveying rollers 118 and the reverse surface of the PS plate 12. Thus the developer 24 supplied is discharged and applied to the reverse surface of the PS plate 12.

One end of a pipeline 130 communicates with the bottom of the second developing tank 16. The other end of the pipeline 130 communicates with a raw developer tank 131. A replenishing developer supply pump 132 ($P_1$) is disposed midway in the pipeline 130. The replenishing developer supply pump 132 is connected to a second replenishment controller 164 which will be described later, and its operation is thereby controlled.

In addition, one end of a pipeline 134 communicates with the bottom of the second developing tank 16. The other end of the pipeline 134 communicates with the water supply tank 88. A water supply pump 136 ($P_3$) is disposed midway in the pipeline 134. This water supply pump 136 is connected to the first replenishment controller 176 as well as the second replenishment controller 164, and its operation is thereby controlled.

Also, one end of a pipeline 138 is passed through the bottom of the second developing tank 16 and projects into the second developing tank 16. The other end of the pipeline 138 is open in a drain tank 140, and the developer 24 overflowing through the pipeline 138 is discharged to the drain tank 140.

Finisher Tank

A partition plate 142 is disposed erected on the side walls partitioning the second developing tank 16 and the finisher tank 20. This partition plate 142 prevents the developer 24 attached to the pair of conveying rollers 118 from mixing into the finisher 152 inside the finisher tank 20.

A pair of conveying rollers 144 are disposed in an upper portion of the finisher tank 20 adjacent to the exit side of the PS plate 12. The pair of conveying rollers 144 are rotatably supported by the unillustrated side plates, and rotate as a driving force of the unillustrated driving means is imparted thereto. The pair of conveying rollers 144 are arranged at a slightly lower position than the pair of conveying rollers 118. The PS plate 12 fed out from between the pair of conveying rollers 118 is inserted between the pair of conveying rollers 144. Thus the PS plate 12 is conveyed through the upper portion of the second developing tank 16 diagonally downward.

A spray pipe 146 having the same construction as that of the aforementioned spray pipe 54 is disposed above the conveying passage of the PS plate 12 between the pair of conveying rollers 118 and the pair of conveying rollers 144. The discharge ports of the spray pipe 146 for discharging the finisher 152 are open toward the upper one of the pair of conveying rollers 144, and discharge the supplied finisher 152 to between the upper one of the pair of conveying rollers 144 and the upper surface of the PS plate 12. This spray pipe 146 communicates with one end of the pipeline 148. The other end of the pipeline 148 communicates with a bottom of the finisher tank 20, a circulation pump 150 being disposed midway thereof. The finisher 152 is stored in a lower portion of the finisher tank 20, and the finisher 152 is supplied into the spray pipe 146 by the operation of the circulation pump 150. Thus the finisher 152 is discharged and applied to the upper surface of the PS plate 12.

A finisher applying box 154 is disposed underneath the conveying passage of the PS plate 12 in correspondence with the spray pipe 146. The finisher applying box 154 has a substantially U-shaped cross section, an opening 154A being formed at an upper portion thereof. A spray pipe 156 is disposed in the finisher applying box 154. This spray pipe 156 has a plurality of discharge ports formed along the axial direction thereof in the same way as the spray pipe 146 such as to be oriented toward a corner of the finisher applying box 154. The spray pipe 156 communicates with a pipeline 148, and the finisher 152 is supplied into the finisher applying box 154 by the operation of the circulation pump 150. The finisher 152 supplied into the finisher applying box 154 overflows from the opening 154A and is applied to the reverse surface of the PS plate 12 passing over the opening 154A.

One end of a pipeline 158 communicates with the bottom of the finisher tank 20. The other end of the pipeline 158 communicates with a raw finisher tank 160. A replenishing finisher supply pump 162 ($P_4$) is disposed midway in the pipeline 158. The replenishing finisher supply pump 162 is connected to the second replenishment controller 164, and its operation is thereby controlled.

Also, one end of a pipeline 166 communicates with the bottom of the finisher tank 20. The other end of the pipeline 166 communicates with the water supply tank 88. A water supply pump 168 ($P_5$) is disposed midway in the pipeline 166. This water supply pump 168 is connected to the first replenishment controller 176 and the second replenishment controller 164, and its operation is thereby controlled.

In addition, one end of a pipeline 170 is passed through the bottom of the finisher tank 20 and projects into the finisher tank 20. The projecting height of the pipeline 170 into the finisher tank 20 sets the height of the level of the finisher 152. The other end of the pipeline 170 is open in a drain tank 172, and discharges the finisher 152 overflowing through the pipeline 170.

A detector 174 connected to the second replenishment controller 164 is disposed on the insertion side of the pair of conveying rollers 22. The detector 174 detects the time duration of passage of the PS plate 12 at the insertion port of the presensitized printing plate processor 10, and the second replenishment controller 164 calculates the area of the PS plate 12 inserted into the presensitized printing plate processor by incorporating into the calculation a processing speed for the PS plate 12 and a width of the PS plate that are preset.

A description will now be given of the operation of this embodiment.

The PS plate 12 with an image printed thereon by an unillustrated printer is inserted between the pair of conveying rollers 22 and between the guide roller 40 and the guide roller 26 in the first developing tank 14, and is inserted into the first developing tank 14. The PS plate 12 is lowered while being guided by the guide rollers 28, 30, 48 and is fed to the central portion of the first developing tank 14.

The large-diameter guide roller 48 guides the tip of the PS plate 12 without causing it to deviate from a predetermined conveying passage, while the guide 52 functions to insert the tip of the PS plate between the pair of conveying rollers 46.

The PS plate 12 inserted between the pair of conveying rollers 46 and fed out therefrom rises while being guided by the guide rollers 32, 34, 36, 42, 38 and 44, and is fed out from the first developing tank 14.

When the PS plate 12 is conveyed while being clamped by the pair of conveying rollers 46 in the developer 24 inside the first developing tank 14, the PS plate 12 is squeezed by the pair of conveying rollers 46, and the developer 24 is sprayed onto it by the spray pipes 54 and 60 immediately afterwards. Also, the developer 24 in the first developing tank 14 is circulated by these spray pipes 54 and 60.

Furthermore, the opposite surfaces of the PS plate 12 are scraped by the brushes 62 and 78, and the swollen or dissolved unnecessary light-sensitive layer is hence scraped off, so that the PS plate 12 is developed substantially completely.

These brushes 62 and 78 are formed of a synthetic resin, are constituted by the twisted brushes 74 or the carpet brushes 66, and are hence provided with a small bristle diameter, so that their bristles have a sufficiently small bending strength not to damage the light-sensitive surface of the PS plate 12. In addition, since the diameters of the brushes 62 and 78 are small enough to allow their rotating shafts 64 and 70 to be disposed in the developer 24, and the developer level cover 202 reduces the area of contact between the developer 24 and air. Accordingly, the deterioration of the developer 24 is prevented and the first developing tank 14 can be made compact, thereby reducing the manufacturing cost.

Immediately after the PS plate 12 passes between the brushes 62, 78, the rear-end portion of the PS plate 12 is supported by the spring-up preventing plates 80, 82; the rear-end portion of the PS plate 12 is prevented from being bent. Accordingly, development can be effected on a stable basis.

In addition, the developer 24 overflowing from the first developing tank 14 and discharged into the overflow tank 18 is discharged to the drain tank 116 through the pipeline 114.

The developer 24 discharged into the overflow tank 18 after overflowing from the first developing tank 14 passes through the pipeline 84 by means of the pump 86 and is supplied again to the first developing tank. Hence, the developer 24 can be utilized effectively.

As the PS plate 12 fed out from the first developing tank 14 is being clamped and conveyed by the pair of conveying rollers 106, the developer 24 is squeezed off the PS plate 12, and the PS plate 12 is fed out to between the pair of conveying rollers 118. The PS plate 12 thus fed out is then conveyed substantially horizontally while being guided by the guide roller 126 through the upper portion of the second developing tank 16.

Midway during this conveyance, the developer 24 is discharged and applied to the opposite surfaces of the PS plate 12 by means of the spray pipes 120 and 128. As a result, the PS plate 12 is completely developed.

Although the developer 24 in the first developing tank 14 is fatigued owing to the development of the PS plate 12, the raw developer and water are replenished into the second developing tank 16 by the second replenishment controller 164, and the developer 24 is replenished into the first developing tank 14 from the second developing tank 16, thereby recovering the fatigue. The developer 24 is discharged from the overflow tank 18 to the drain tank 116 via the pipeline 134.

Since the PS plate 12 to which the developer 24 is applied in the second developing tank 16 has already been subjected to development in the first developing tank 14, the amount of deterioration of the developer 24 due to processing in the second developing tank 16 is small. Accordingly, since the developer 24 in the second developing tank 16 is supplied into the first developing tank 14, the developer 24 can be used for extended periods of time.

In addition, since the upper surface of the developer 24 is covered with the developer level cover 202, the deterioration of the developer 24 by the air is prevented, and the evaporation of the developer 24 is prevented.

In consequence, the developer 24 can be used for extended periods of time on a stable basis for processing the PS plate 12.

Next, a description will be given of the replenishment of the developer 24.

In cases where a multiplicity of PS plates 12 are developed in the first developing tank 14, the developer 24 becomes fatigued. In order to effect recovery from the deterioration of the developer 24, the area of the PS plate 12 to be processed is detected by the detector 174, and a calculation is conducted by the second replenishment controller 164 so as to replenish a required amount of the developer 24.

Specifically, the arrangement provided is such that the area of the PS plate 12 to be inserted is detected by the detector 174, the operating times of the replenishing developer supply pump 132 and the water supply pump 136 are calculated by the second replenishment controller 164 on the basis of the detected result, and the replenishing developer supply pump 132 and the water supply pump 136 are operated so as to supply the replenishing developer by an amount corresponding to the area of the PS plate 12. Then, the supply pump 58 is operated for a fixed time so that the developer 24, the amount of which is equivalent to the amount replenished into the second developing tank 16 and which is substantially close to a new solution, can be supplied into the first developing tank 14.

The electrical conductivity of the developer 24 is detected by the conductivity detector 96, and if the developer 24 becomes condensed and the electrical conductivity increases above a predetermined value, the water supply pump 92 is operated by the first replenishment controller 176 so as to supply water into the first developing tank 14. In addition, with respect to the second developing tank 18 and the finisher tank 20 as well, the amount of water to evaporate is measured in advance, and the water supply pump 136 and the water supply pump 168 are operated in proportion to the operation of the water supply pump 92. The amount of water to be replenished is set to 10 cc-1,000 cc/cycle.

The raw finisher and water are replenished to the finisher tank 20 by the replenishing finisher supply pump 162 and the water supply pump at fixed rates by being controlled by the second replenishment controller 164.

As a result, the condensation of the developer 24 and the finisher 152 is prevented, and as the activity of the developer 24 and the finisher 152 are maintained at constant levels, so that stable development over extended periods of time is possible.

Although in this embodiment an example of the ordinary presensitized printing plate 12 has been given as a light-sensitive material, the present invention is not restricted to the same, and the present invention can be applied to a developing apparatus for a light-sensitive recording material, such as a developing apparatus for a planographic printing plate using no water, as another example of light-sensitive material.

Although, in this embodiment, examples using the carpet brush 66 and the twisted brush 74 have been shown, the invention is not restricted to the same and any other type of brush may be used insofar as it has a sufficiently small bending strength or resiliency.

Although, in this embodiment, the separately formed shielding plates 180, 184 have been illustrated as shielding portions for shielding the axially opposite ends of the brush 62 and the guide roller 42, the invention is not restricted to this arrangement, and the shielding portions may be formed integrally with the developer level cover 202.

Figure 9:
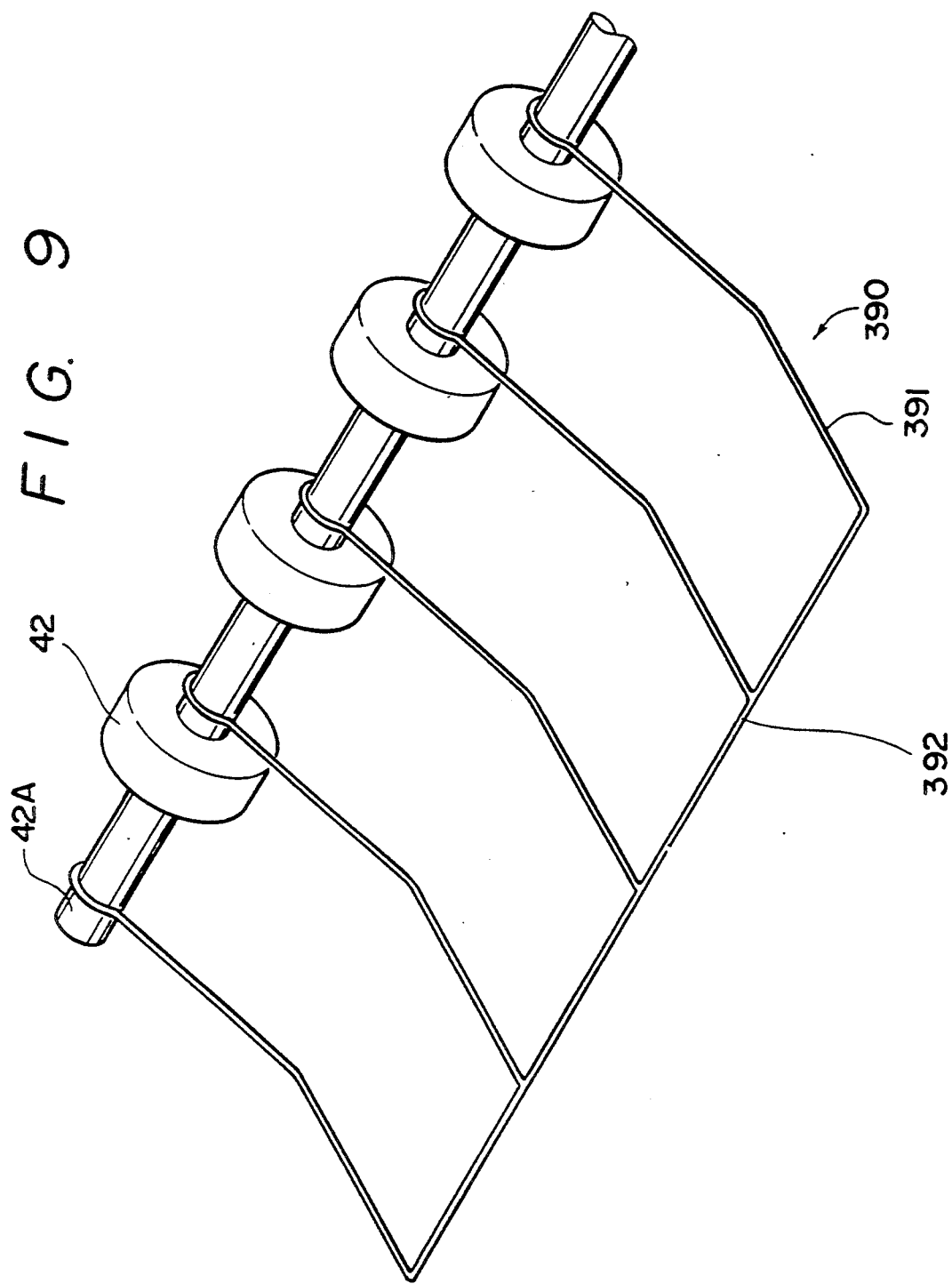
FIGS. 9 to 11 are perspective views respectively illustrating bending preventing means.
Figure 10:
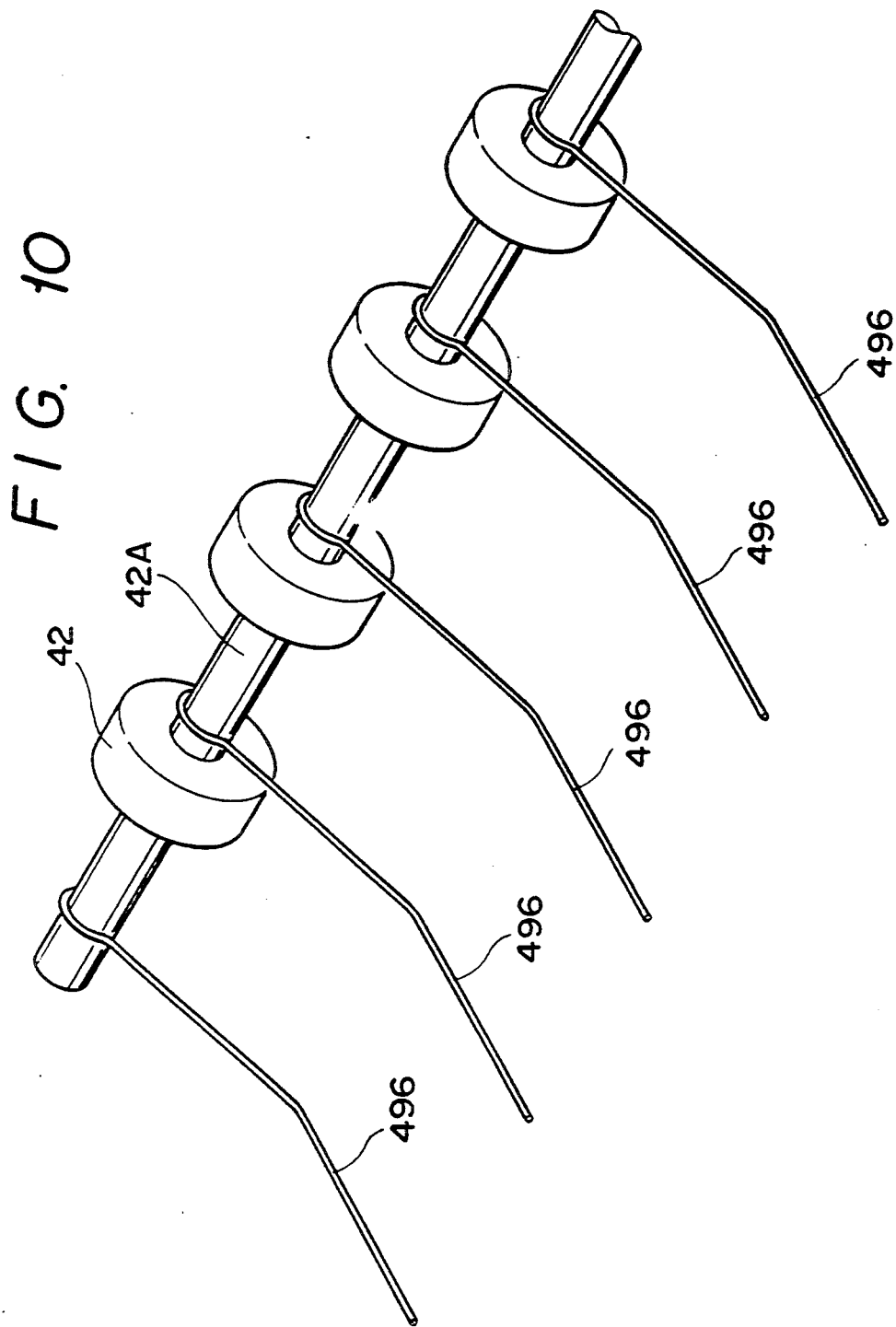
Figure 11:
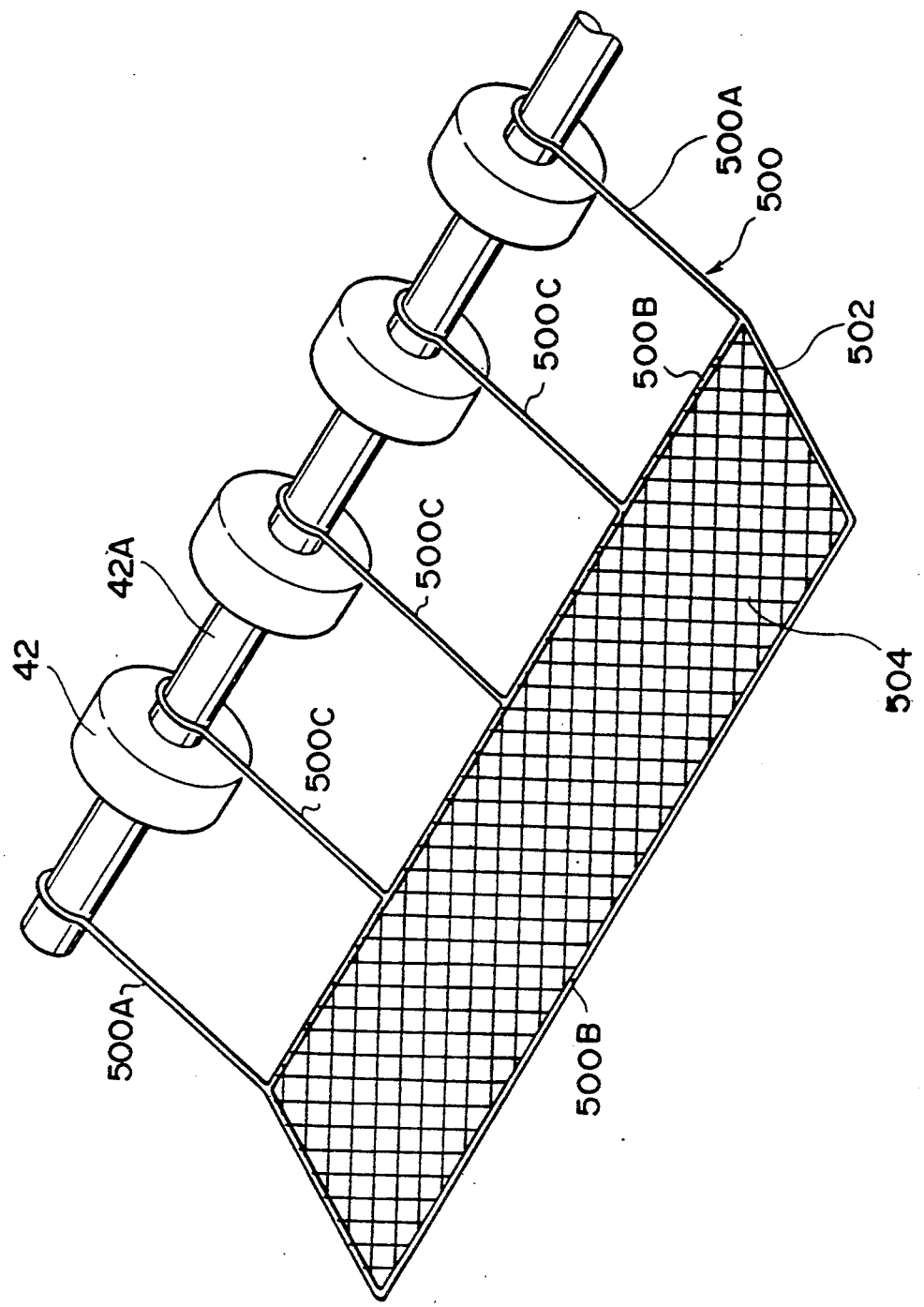

Referring now to FIGS. 9 to 11, a description will be given of other examples of the means for preventing the bending of the PS plate.

As shown in FIG. 9, the bending preventing means comprises a spring.up preventing rod member 390 formed by subjecting wire rods to bending and welding or other similar process. Specifically, this spring-up preventing rod member 390 comprises a plurality of (five in the illustration) mutually parallel first wire rods 391 of an equal length each having one end supported by the rotating shaft 42A and the other end extending toward the brush 62, as well as a second wire rod connecting the other ends of the first wire rods 391. The first wire rods 391 are bent at their intermediate portions in the direction of conveyance of the light-sensitive material, in the same way as the above-described spring-up preventing plate 80.

The spring.up preventing rod member thus arranged supports the rear-end portion of the PS plate 12 being conveyed, so that the rear-end portion of the PS plate 12 is prevented from being bent. Since the spring-up preventing rod member 390 is formed of wire rods, it is more lightweight than the aforementioned spring-up preventing plate 80.

FIG. 10 shows another example of the bending preventing means.

This bending preventing means is composed of a plurality of wire rods 496 each having one end retained by the rotating shaft 42A and the other end extending toward the vicinity of the brush 62 (not shown in FIG. 10). Intermediate portions of these wire rods 496 are bent in the same way as the aforementioned first wire rods 391. The operation and effect of the bending preventing means thus arranged are the same as those of the aforementioned spring-up preventing rod member 390.

FIG. 11 shows still another example of the bending preventing means.

This bending preventing means comprises a frame portion 500 formed of a wire rod as well as a metal net 502 supported by the frame portion 500. Specifically, the frame portion 500 comprises a pair of first wire rod portions 500A each having one end retained by the rotating shaft 42A and the other end extending to the vicinity of the brush 62 (not shown in FIG. 11); a pair of second wire rod portions 500B respectively connecting together the other ends of the first wire rod portions 500A and bent portions provided at intermediate portions of the first wire rod portions 500A; and third wire rod portions 500C each having one end connected to the rotating shaft 42A and the other end to the second wire rod portion 500B connecting the respective bent portions. In addition, the metal net 502 is attached to a rectangular hole 504 portion defined by both the first wire rod portions 500A and the second wire rod portions 500B. In this example as well, the operation and effect are similar to those of the aforementioned spring-.up preventing plate 80, but in this example the bending preventing means is made more lightweight than the spring.up preventing plate 80.

What is claimed is:

1. A light-sensitive material processing apparatus for processing an image-wise exposed light-sensitive material by immersing the light-sensitive material in a processing solution accommodated in a processing tank, while the light-sensitive material is being conveyed, said apparatus comprising:

scraping brush means comprising a shaft having a spiral groove in an outer periphery thereof, and an elongated brush supported in said spiral groove and wound spirally around said outer periphery of said shaft and formed of a synthetic resin, for scraping a light-sensitive surface of the light-sensitive material; and bending preventing means disposed downstream of said scraping brush means in a direction of conveyance of the light-sensitive material for preventing the bending of a rear-end portion of the light-sensitive material scraped by said scraping brush means.

2. A light-sensitive material processing apparatus according to claim 1, wherein said elongated brush is constituted by a twisted brush.

3. A light-sensitive material processing apparatus according to claim 1, wherein said elongated brush is constituted by an elongated carpet brush.

4. A light-sensitive material processing apparatus according to claim 1, further comprising a floating cover for shielding a surface of the processing solution from air and adapted to float on the processing solution.

5. A light-sensitive material processing apparatus according to claim 4, wherein said floating cover has a projecting portion projecting upwardly in correspondence with an exposed portion of said scraping brush means exposed upwardly of said processing solution, said projecting portion projecting in such a manner as to cover said exposed portion.

6. A light-sensitive material processing apparatus for processing an imagewise exposed light-sensitive material by immersing the light-sensitive material in a processing solution accommodated in a processing tank, while the light-sensitive material is being conveyed, said apparatus comprising:

scraping brush mean comprising a shaft and an elongated brush wound spirally around an outer periphery of said shaft and formed of synthetic resin for scraping a light-sensitive surface of the light-sensitive material; and bending preventing means disposed downstream of said scraping brush means in a direction of conveyance of the light-sensitive material for preventing the bending of a rear-end portion of the light-sensitive material scraped by said scraping brush means, said bending preventing means being constituted by a tabular member which has one end portion supported by a shaft member rotatably supporting a guide roller for guiding the light-sensitive material disposed downstream of said scraping brush means in the direction of conveyance of said light-sensitive material, and has an opposite end portion extending toward said scraping brush means.

7. A light-sensitive material processing apparatus according to claim 5, wherein said tabular member is provided with a recess at said one end portion for disposition of said guide roller therein.

8. A light-sensitive material processing apparatus according to claim 6, wherein said tubular member is bent at an intermediate portion thereof between said one end portion and said opposite end portion, a flat portion being provided in such a manner as to extend from said intermediate portion to said opposite end portion.

9. A light-sensitive material processing apparatus for processing an imagewise exposed light-sensitive material by immersing the light-sensitive material in a processing solution accommodated in a processing tank, while the light-sensitive material is being conveyed, said apparatus comprising:

scraping brush means comprising a shaft and an elongated brush wound spirally around an outer periphery of said shaft and formed of synthetic resin for scraping a light-sensitive surface of the light-sensitive material; and bending preventing means disposed downstream of said scraping brush means in a direction of conveyance of the light-sensitive material for preventing the bending of a rear-end portion of the light-sensitive material scraped by said scraping brush means, said bending preventing means being constituted by a wire rod member which has one end portion supported by a shaft member rotatably supporting a guide roller for guiding the light-sensitive material disposed downstream of said scraping brush means in the direction of conveyance of said light-sensitive material, and has another end portion extending toward said scraping brush means.

10. A light-sensitive material processing apparatus according to claim 9 wherein said wire rod member has a plurality of mutually parallel wire rods, the other end portions thereof being connected by another wire rod disposed substantially parallel with said shaft member.

11. A light-sensitive material processing apparatus according to claim 9, wherein said wire rod member has a plurality of mutually parallel wire rods, a metal net being attached between said wire rods.

12. A light-sensitive material processing apparatus for processing an image-wise exposed light-sensitive material by immersing the light-sensitive material in a processing solution accommodated in a processing tank, while the light-sensitive material is being conveyed, said apparatus comprising:

scraping brush means comprising a shaft and an elongated brush wound spirally around an outer periphery of said shaft and formed of synthetic resin for scraping a light-sensitive surface of the light-sensitive material;

bending preventing means disposed downstream of said scraping brush means in a direction of conveyance of the light-sensitive material for preventing the bending of a rear-end portion of the light-sensitive material scraped by said scraping brush means; and a floating cover for shielding a surface of the processing solution from air to float on the processing solution, and having a projecting portion projecting upwardly in correspondence with an exposed portion of said scraping brush means exposed upwardly of said processing solution to cover said exposed portion, said projecting portion having a shielding portion for shielding an axial end of said scraping brush means.

13. A light-sensitive material processing apparatus for processing an image-wise exposed light-sensitive material by immersing the light-sensitive material in a processing solution accommodated in a processing tank, while the light-sensitive material is being automatically conveyed, said apparatus comprising:

scraping brush means comprising a shaft and an elongated brush wound spirally around an outer periphery of said shaft and formed of synthetic resin for scraping a light-sensitive surface of the light-sensitive material; and a floating cover floating on said processing solution and adapted to shield a surface of the processing solution from air as said floating cover moves vertically in conjunction with a rise and fall of the level of the processing solution, said floating cover having a projecting portion projecting upwardly in correspondence with an exposed portion of said scraping brush means exposed upwardly of said processing solution, said projecting portion projecting in such a manner as to cover said exposed portion, and wherein said projecting portion has a shielding portion for shielding an axial end of said scraping brush means.

14. A light-sensitive material processing apparatus according to claim 13, further comprising bending preventing means disposed downstream of said scraping brush means in a direction of conveyance of the light-sensitive material and adapted to prevent the bending of a rear-end portion of the light-sensitive material shaped by said scraping brush means.

15. A light-sensitive material processing apparatus for processing an image-wise exposed light-sensitive material by immersing the light-sensitive material in a processing solution accommodated in a processing tank, while the light-sensitive material is being automatically conveyed, said apparatus comprising:

scraping brush mean comprising a shaft disposed in such a manner as to have an axis in a direction substantially perpendicular to a direction of conveyance of the light-sensitive material and an elongated brush wound spirally around an outer periphery of said shaft and formed of a synthetic resin, for scraping a light-sensitive surface of the light-sensitive material, said shaft being provided with a spiral groove in said outer periphery thereof, and said elongated brush being wound spirally around said shaft by being supported in said groove; and a floating cover floating on said processing solution and adapted to shield a surface of the processing solution from air as said floating cover moves vertically in conjunction with a rise and fall of the level of the processing solution.

16. A light-sensitive material processing apparatus according to claim 13, wherein said elongated brush is constituted by either one of a twisted brush and an elongated carpet brush.

17. A light-sensitive material processing apparatus for processing an image-wise exposed light-sensitive material by immersing the light-sensitive material in a processing solution accommodated in a processing tank, while the light-sensitive material is being automatically conveyed, said apparatus comprising:

scraping brush means comprising a shaft disposed in such a manner as to have an axis in a direction substantially perpendicular to a direction of conveyance of the light-sensitive material and an elongated brush wound spirally around an outer periphery of said shaft and formed of a synthetic resin, for scraping a light-sensitive surface of the light-sensitive material.

a floating cover floating on said processing solution and adapted to shield a surface of the processing solution from air as said floating cover moves vertically in conjunction with a rise and fall of the level of the processing solution; and bending preventing means disposed downstream of said scraping brush means in a direction of conveyance of the light-sensitive material and adapted to prevent the bending of a rear-end portion of the light-sensitive material scraped by said scraping brush means, said bending preventing means being constituted by a tabular member which has one end portion supported by a shaft member rotatably supporting a guide roller for guiding the light-sensitive material disposed downstream of said scraping brush means in the direction of conveyance of said light-sensitive material, and has an opposite end portion extending toward said scraping brush means.

18. A light-sensitive material processing apparatus for processing an image-wise exposed light-sensitive material by immersing the light-sensitive material in a processing solution accommodated in a processing tank, while the light-sensitive material is being automatically conveyed, said apparatus comprising:

scraping brush means comprising a shaft disposed in such a manner as to have an axis in a direction substantially perpendicular to a direction of conveyance of the light-sensitive material an dan elongated brush wound spirally around an outer periphery of said shaft and formed of a synthetic resin, for scraping a light-sensitive surface of the light-sensitive material;

a floating cover floating on said processing solution and adapted to shield a surface of the processing solution from air as said floating cover moves vertically in conjunction with a rise and fall of the level of the processing solution; and bending preventing means disposed downstream of said scraping brush means in a direction of conveyance of the light-sensitive material and adapted to prevent the bending of a rear-end portion of the light-sensitive material scraped by said scraping brush means, said bending preventing means being constituted by a tabular member which has one end portion supported by a shaft member rotatably supporting a guide roller for guiding the light-sensitive material disposed downstream of said scraping brush means in the direction of conveyance of said light-sensitive material, and has another end portion extending toward said scraping brush means.

19. A light-sensitive material processing apparatus for processing an image-wise exposed light-sensitive material by immersing the light-sensitive material in a processing solution accommodated in a processing tank, while the light-sensitive material is being conveyed, said apparatus comprising:

a shaft disposed in said processing solution to be rotated;

a floating cover means for substantially covering an entire upper surface of said processing solution; and an elongated brush comprising one of a twisted brush and a carpet brush and wound spirally around an outer periphery of said shaft, for scraping a light-sensitive surface of the immersed light-sensitive material by the rotation of said shaft, said floating cover having a projecting portion projecting upwardly in correspondence with an exposed portion of said elongated brush exposed upwardly of said processing solution, said projecting portion projecting in such a manner as to cover said exposed portion, sand wherein said projecting portion has a shielding portion for the shielding axial end of said elongated brush.

* * * * *

UNITED STATES PATENT AND TRADEMARK OFFICE
CERTIFICATE OF CORRECTION

PATENT NO.   : 5,136,322
DATED        : August 4, 1992
INVENTOR(S)  : Hisao Ohba, Hisao Kanzaki, Kenji Kunichika It is certified that error appears in the above-identified patent and that said Letters Patent is hereby corrected as shown below:

On the title page, please correct the name of the second inventor as follows:

[75] Inventors: Hisao Ohba, Kanagawa; Hisao Kanzaki; Kenji Kunichika, both of Shizuoka, all of Japan Signed and Sealed this Twenty-eighth Day of September, 1993

Attest:

BRUCE LEHMAN

*Attesting Officer*    *Commissioner of Patents and Trademarks*